United States Patent
Wu et al.

(10) Patent No.: US 11,610,857 B2
(45) Date of Patent: Mar. 21, 2023

(54) METHOD OF MANUFACTURING CIRCUIT STRUCTURE

(71) Applicant: Winbond Electronics Corp., Taichung (TW)

(72) Inventors: Jin-Neng Wu, Taichung (TW); Yen-Jui Chu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 77 days.

(21) Appl. No.: 17/469,868

(22) Filed: Sep. 8, 2021

(65) Prior Publication Data

US 2021/0407946 A1    Dec. 30, 2021

Related U.S. Application Data

(62) Division of application No. 16/264,696, filed on Feb. 1, 2019, now abandoned.

(51) Int. Cl.
*H01L 23/00* (2006.01)

(52) U.S. Cl.
CPC .............. *H01L 24/13* (2013.01); *H01L 24/11* (2013.01); *H01L 2224/1132* (2013.01); *H01L 2224/13008* (2013.01); *H01L 2224/13239* (2013.01); *H01L 2224/13247* (2013.01); *H01L 2224/13564* (2013.01)

(58) Field of Classification Search
CPC ..................... H01L 24/13; H01L 24/11; H01L 2224/13008; H01L 2224/1132; H01L 2224/13247; H01L 2224/13564; H01L 2224/13239
See application file for complete search history.

(56) References Cited

U.S. PATENT DOCUMENTS

2013/0187277 A1* 7/2013 Chen ....................... H01L 24/05
257/762

* cited by examiner

*Primary Examiner* — Robert G Bachner
(74) *Attorney, Agent, or Firm* — JCIPRNET

(57) ABSTRACT

Provided is a circuit structure including a substrate, a pad, a dielectric layer, a conductive layer, an adhesion layer, and a conductive bump. The pad is disposed on the substrate. The dielectric layer is disposed on the substrate and exposes a portion of the pad. The conductive layer contacts the pad and extends from the pad to cover a top surface of the dielectric layer. The adhesion layer is disposed between the dielectric layer and the conductive layer. The conductive bump extends in an upward manner from a top surface of the conductive layer. The conductive bump and the conductive layer are integrally formed. A method of manufacturing the circuit structure is also provided.

10 Claims, 3 Drawing Sheets

METHOD OF MANUFACTURING CIRCUIT STRUCTURE

CROSS-REFERENCE TO RELATED APPLICATION

This is a divisional application of and claims the priority benefit of U.S. application Ser. No. 16/264,696, filed on Feb. 1, 2019, now pending. The entirety of the above-mentioned patent application is hereby incorporated by reference herein and made a part of this specification.

BACKGROUND

Technical Field

The disclosure relates to a semiconductor structure and a method of manufacturing the same, and more particularly to a circuit structure and a method of manufacturing the same.

Description of Related Art

Recently, the continuous increase in the integration of various electronic components (e.g., transistors, diodes, resistors, capacitors, and so on) leads to the rapid growth of the semiconductor industry. The increase in the integration mostly results from the continuous reduction of the minimum feature size, so that more components can be integrated into a given area.

Compared to the convention package structure, these electronic components with smaller size occupy smaller area and thus require a smaller package structure. For instance, a semiconductor chip or die has an increasing number of input/output (I/O) solder pads, and a redistribution layer (RDL) can redistribute the original I/O solder pads of the semiconductor chip or die to be located around the semiconductor chip or die, so as to increase the number of I/O solder pads.

However, in the conventional wafer level packaging process, the RDL structure and a copper pillar bump have a multi-layer structure formed by repeatedly performing sputtering, plating, lithography, etching, and other manufacturing processes. In addition to the cumbersome steps, the yield loss, material waste, and diversification of the manufacturing machine in the plural manufacturing processes lead to the increase in the manufacturing costs. Besides, the adhesion issue may occur in layers of the multi-layer structure, and intermetallic compounds (IMCs) are likely to be generated among different metal materials. Hence, the interface between the conventional RDL structure and the copper pillar bump often suffers from peeling and being crack during the reliability test.

SUMMARY

The disclosure provides a circuit structure including a substrate, a pad, a dielectric layer, a conductive layer, an adhesion layer, and a conductive bump. The pad is disposed on the substrate. The dielectric layer is disposed on the substrate and exposes a portion of the pad. The conductive layer contacts the pad and extends from the pad to cover a top surface of the dielectric layer. The adhesion layer is disposed between the dielectric layer and the conductive layer. The conductive bump extends in an upward manner from a top surface of the conductive layer. The conductive bump and the conductive layer are integrally formed.

The disclosure provides a method of manufacturing a circuit structure. A pad is formed on a substrate. A dielectric layer is formed on the substrate. The dielectric layer has an opening exposing a portion of the pad. An adhesion layer is formed on the dielectric layer. The adhesion layer covers a sidewall of the opening and extends to cover a top surface of the dielectric layer. A circuit layer is formed by using a first three-dimensional (3D) printing technology. The circuit layer includes a conductive layer and a conductive bump. The conductive layer contacts the pad and extends along a first direction from the pad to cover a top surface of the adhesion layer. The conductive bump extends along a second direction from a first top surface of the conductive layer on the adhesion layer. The first direction is different from the second direction. A passivation layer is formed on the circuit layer. The passivation layer covers a second top surface of the conductive layer and covers a portion of a sidewall of the conductive bump. A solder layer is formed on the conductive bump.

In view of the above, the 3D printing technology is applied in the disclosure to form the circuit layer (including the conductive layer and the conductive bump), so that the conductive layer and the conductive bump are integrally formed. Namely, the conductive layer and the conductive bump are made of the same material in the same manufacturing step, so as to prevent the adhesion and IMC issues between different materials. Thereby, the structural strength between the conductive layer and the conductive bump in the circuit structure can be significantly improved according to one or more embodiments of the disclosure, and product reliability can be further improved. In addition, the method of manufacturing the circuit structure provided herein has simple manufacturing steps, thus enhancing commercial competitiveness of the product.

To make the above features and advantages described in one or more of the embodiments provided in the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
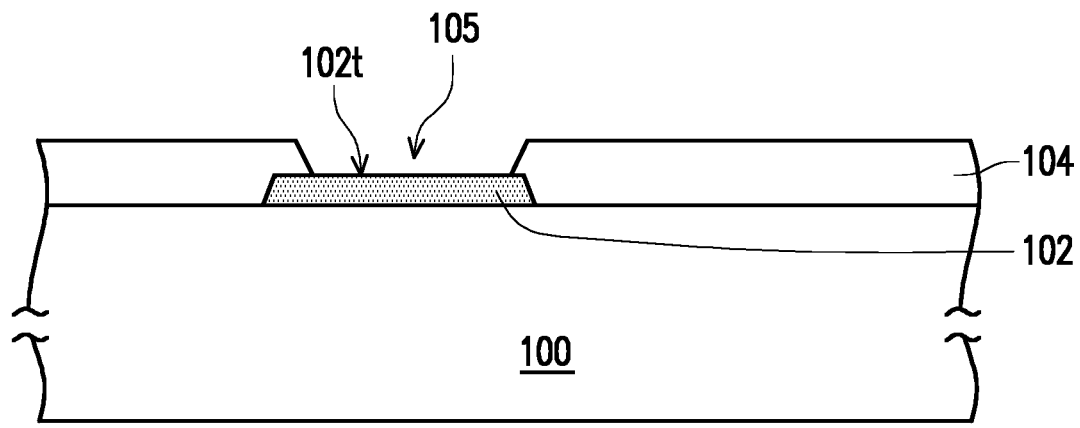
FIG. 1A to FIG. 1E are schematic cross-sectional views illustrating a manufacturing process of a circuit structure according to an embodiment of the disclosure.

The invention will be described in a more comprehensive manner with reference to the drawings of the embodiments. This invention, however, may be embodied in many different forms and should not be construed as limited to the embodiments set forth herein. The thickness of layers and regions in the drawings may be exaggerated for clarity. The same or similar reference numbers used in the embodiments represent the same or similar devices. Accordingly, no further description thereof is provided hereinafter.

FIG. 1A to FIG. 1E are schematic cross-sectional views illustrating a manufacturing process of a circuit structure according to an embodiment of the disclosure. FIG. 2 is an enlarged cross-sectional view illustrating a portion of the circuit structure depicted in FIG. 1C. Here, the circuit structure provided in the present embodiment may be a redistribution layer (RDL) structure, which should however not be construed as a limitation in the disclosure. In other embodiments, the circuit structure may also be an interconnect structure in a back-end-of-line (BEOL) process, a circuit structure in a circuit board, or any other similar structure.

Figure 2:
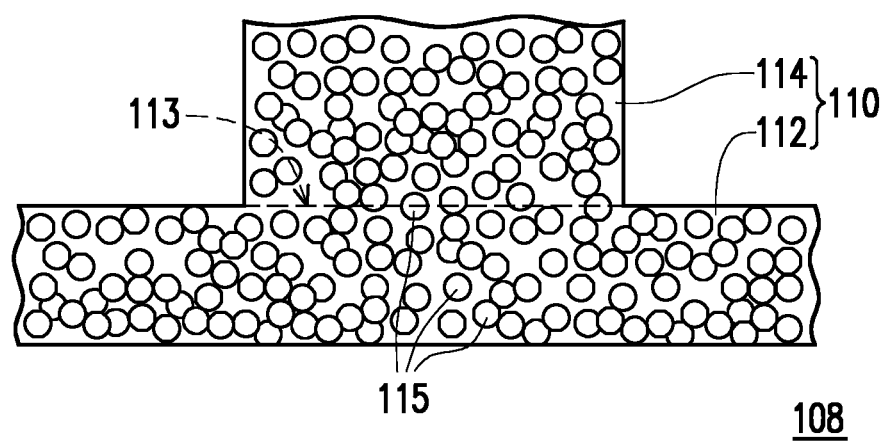
FIG. 2 is an enlarged cross-sectional view illustrating a portion of the circuit structure depicted in FIG. 1C.

With reference to FIG. 1A, a method of manufacturing a circuit structure includes following steps. Firstly, a substrate 100 is provided. According to an embodiment, the substrate 100 includes a semiconductor material. In particular, the substrate 100 may be made of at least one semiconductor material selected from the group consisting of Si, Ge, SiGe, GaP, GaAs, SiC, SiGeC, InAs, and InP. In the present embodiment, the substrate 100 may be, for example, a silicon substrate. Besides, the substrate 100 may also include a silicon on insulator (SOI) substrate. In FIG. 1A, no device is disposed in the substrate 100; however, the substrate 100 provided in the present embodiment may be equipped with active devices (e.g., a transistor, a diode, and so on), passive devices (e.g., a capacitor, an inductor, a resistor, and so on), or a combination thereof. In other embodiments, the substrate 100 may be equipped with logic devices, memory devices, or a combination thereof.

A pad 102 is then formed on the substrate 100. According to an embodiment, the material of the pad 102 includes a metallic material, such as copper, aluminum, gold, silver, nickel, palladium, or a combination thereof. A method of forming the pad 102 includes physical vapor deposition (PVD), plating, or a combination thereof. Only one pad 102 is illustrated in FIG. 1A, however, the invention is not limited thereto. In other embodiments, the number of the pad 102 may be adjusted according to actual demands. According to an embodiment, the pad 102 may be electrically connected to devices (not shown) in the substrate 100.

After that, a dielectric layer 104 is formed on the substrate 100. The dielectric layer 104 covers a sidewall of the pad 102 and one portion of a top surface of the pad 102. As shown in FIG. 1A, the dielectric layer 104 has an opening 105. The opening 105 exposes another portion of a top surface 102t of the pad 102. According to an embodiment, the material of the dielectric layer 104 includes a dielectric material, such as silicon oxide, silicon nitride, silicon oxynitride, polyimide, or a combination thereof. A method of forming the dielectric layer 104 includes PVD, chemical vapor deposition (CVD), or a combination thereof.

Figure 1B:
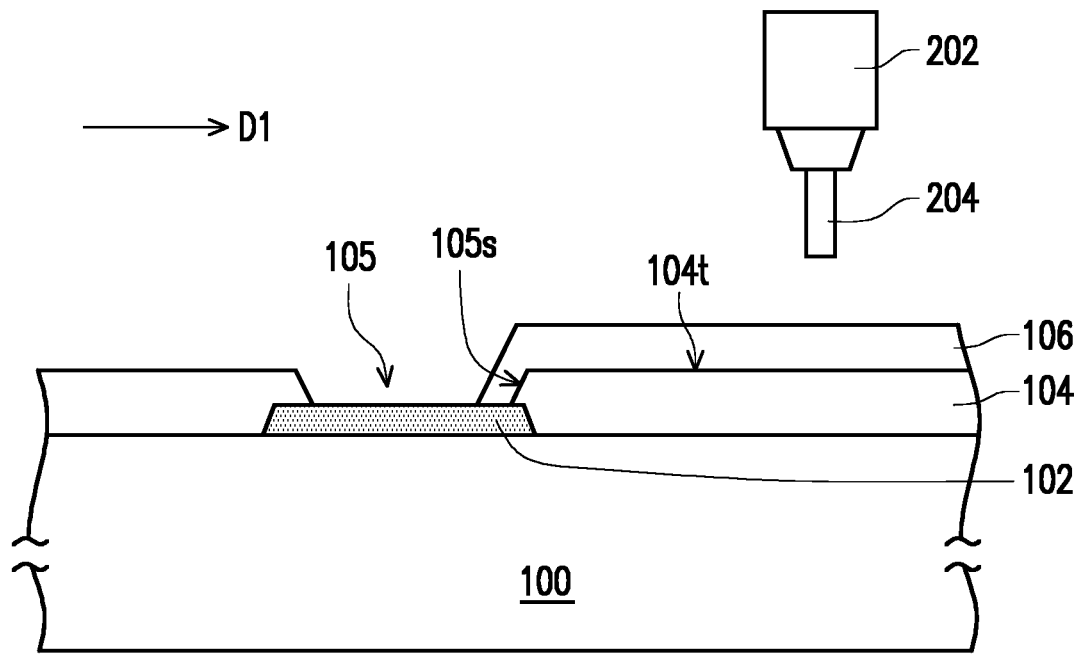

With reference to FIG. 1B, the adhesion layer 106 is formed by using a 3D printing technology. According to an embodiment, the 3D printing technology includes an ink jet printing process, an aerosol jet printing process, or a combination thereof. The aerosol jet printing process is taken as an example, wherein an aerosol jet deposition head is applied to form an annularly propagating jet constituted by an outer sheath flow and an inner aerosol-laden carrier flow. During the aerosol jet printing process, an aerosol stream of the to-be-deposited materials is concentrated and deposited onto a surface to be formed. Said step may be referred to as maskless mesoscale material deposition (M3D), i.e., the deposition step can be performed without using any mask.

Figure 1C:
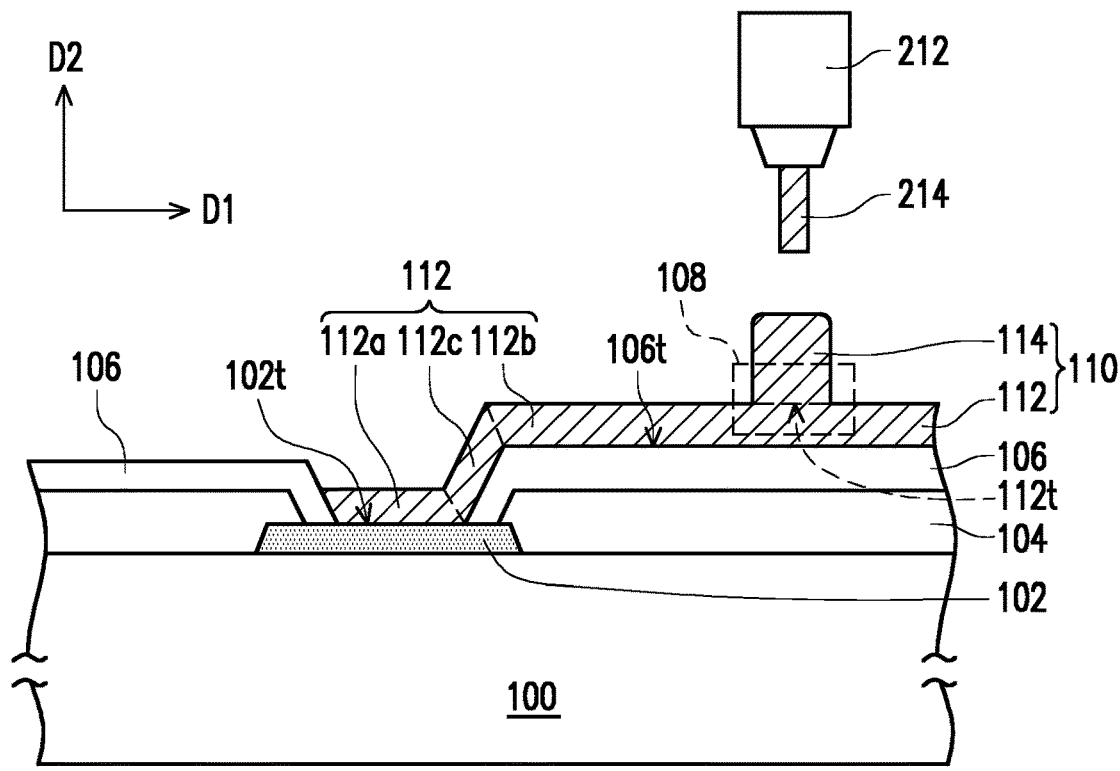

In the present embodiment, as shown in FIG. 1B, the nozzle 202 of the 3D printing apparatus is applied to eject an insulation ink 204 onto the dielectric layer 104 along a first direction D1. According to an embodiment, the insulation ink 204 includes an insulation material and a solvent. For instance, the insulation material may be polyimide, polyurethane (PU), or the like. The solvent may be N-Methyl-2-pyrrolidone (NMP), propylene glycol monomethyl ether (PGME), ethylene glycol, or the like. After a curing step is performed, the insulation ink 204 is cured and becomes the adhesion layer 106. In an alternative embodiment, the curing step includes a heating step or an irradiating step for volatilizing the solvent in the insulation ink 204 and curing the insulation ink 204. In this case, as shown in FIG. 1B, the adhesion layer 106 covers a sidewall 105s of the opening 105 and extends to cover a top surface 104t of the dielectric layer 104. According to an embodiment, the adhesion layer 106 includes an insulation compound, such as polyimide, PU, SU-8, an adhesive, or a combination thereof. In the present embodiment, the adhesion layer 106 can increase the adhesion between the dielectric layer 104 and the subsequently formed conductive layer 112 (as shown in FIG. 1C). In the present embodiment, a minimum thickness of the adhesion layer 106 may be from 0.8 µm to 3 µm, which should however not be construed as a limitation in the disclosure; in other embodiments, the thickness of the adhesion layer 106 may be increased by a printing build-up method.

With reference to FIG. 1C, the circuit layer 110 is formed by using the 3D printing technology. The circuit layer 110 includes a conductive layer 112 and a conductive bump 114. Specifically, the nozzle 212 of the 3D printing apparatus is applied to eject a conductive ink 214 along the first direction D1 onto the adhesion layer 106 to form the conductive layer 112 and eject the conductive ink 214 along the second direction D2 onto the conductive layer 112 to form the conductive bump 114. In this case, as shown in FIG. 1C, the conductive layer 112 extends from the pad 102 along the first direction D1 to cover a top surface 106t of the adhesion layer 106. Particularly, the conductive layer 112 may include a first portion 112a, a second portion 112b, and a third portion 112c. The first portion 112a covers and contacts the top surface 102t of the pad 102. The second portion 112b covers and contacts the top surface 106t of the adhesion layer 106. The third portion 112c is located between the first portion 112a and the second portion 112b. That is, the third portion 112c may be considered as a connecting portion or an inclined portion for connecting the first portion 112a and the second portion 112b. Besides, the conductive bump 114 extends along the second direction D2 from the top surface 112t of the conductive layer 112 on the adhesion layer 106, wherein the top surface 112t may be considered as a first top surface. That is, the conductive bump 114 extends in an upward manner from the top surface 112t in the second portion 112b. In an embodiment provided in the disclosure, the first direction D1 is different from the second direction D2. Besides, the first direction D1 is perpendicular to the second direction D2.

According to an embodiment, a minimum thickness of the conductive layer 112 may be from 0.5 µm to 5 µm, and a minimum height of the conductive bump 114 is from 20 µm to 30 µm, which should however not be construed as a limitation in the disclosure; in other embodiments, the thickness of the conductive layer 112 or the height of the conductive bump 114 can be increased by a printing build-up method.

According to an embodiment, the conductive ink 214 includes a plurality of conductive particles 115 and a solvent. The solvent includes NMP, PGME, ethylene glycol, or the like. To be specific, with reference to the enlarged view 2 of a portion 108 of the circuit layer 110 of FIG. 1C, after the curing step is performed, the circuit layer 110 (including the conductive layer 112 and the conductive bump 114) is constituted by a plurality of conductive particles 115 contacting each other. According to an embodiment, the conductive particles 115 include a plurality of metal nanoparticles, e.g., silver nanoparticles, copper-silver nanoparticles, copper nanoparticles, or a combination thereof. According to another embodiment, an average diameter of the conductive particles 115 may be from 5 nm to 1000 nm. Standard deviation of particle diameter distribution of the conductive particles 115 may be from 4.55 to 43. In some embodiments, the circuit layer 110 is formed by the ball-shaped conductive particles 115 which are tightly connected, so as to achieve the effect of uniform electrical conductivity. In other embodiments, the conductive particles 115 may each have different diameters.

On the other hand, as shown in FIG. 2, the conductive layer 112 and the conductive bump 114 share one or more of the conductive particles 115. In other words, at least one of the conductive particles 115 crosses a virtual interface 113 between the conductive layer 112 and the conductive bump 114. Note that there is no actual interface between the conductive layer 112 and the conductive bump 114. The virtual interface 113 herein is provided to clearly define that the conductive layer 112 and the conductive bump 114 are integrally formed. The so-called "integrally formed" may be considered as being formed in the same manufacturing process with use of the same material. For instance, the conductive layer 112 and the conductive bump 114 are formed by applying the same 3D printing technology with use of the same conductive ink 214. Since the conductive layer 112 and the conductive bump 114 are integrally formed, the adhesion and IMC issues between different materials can be prevented in the present embodiment. Thereby, the structural strength between the conductive layer 112 and the conductive bump 114 can be significantly improved according to the present embodiment, and product reliability can be further improved. That is to say, the adhesion between the conductive layer 112 and the conductive bump 114 provided in the present embodiment is stronger than that of the conventional RDL structure, so that the conductive layer 112 and the conductive bump 114 are not easily peeled off or crack.

Figure 1D:
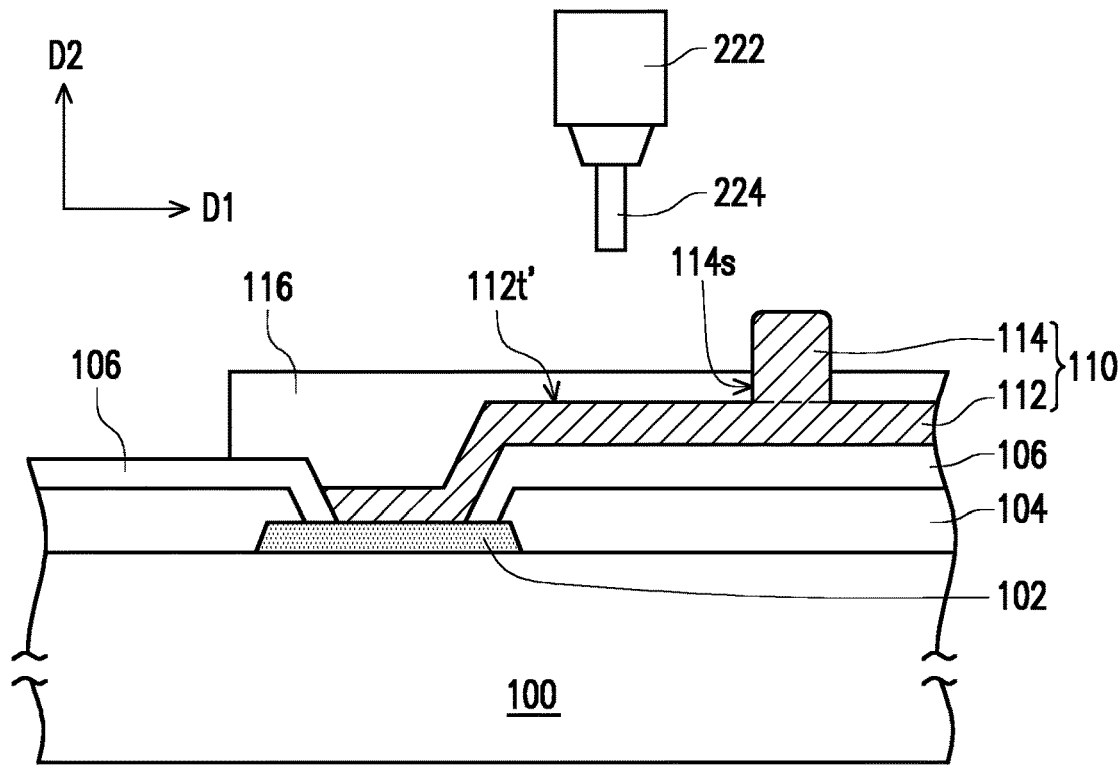

With reference to FIG. 1D, a passivation layer 116 is formed by using the 3D printing technology. Specifically, an insulation ink 224 is ejected onto the conductive layer 112 along the first direction D1 by a nozzle 222 of the 3D printing apparatus. According to an embodiment, the insulation ink 224 includes an insulation material and a solvent. The insulation material includes polyimide, PU, or the like. The solvent includes NMP, PGME, ethylene glycol, or the like. After a curing step is performed, the insulation ink 224 is cured and becomes the passivation layer 116. In an alternative embodiment, the curing step includes a heating step or an irradiating step for volatilizing the solvent in the insulation ink 224 and curing the insulation ink 224. In this case, as shown in FIG. 1D, the passivation layer 116 covers a top surface 112t' of the conductive layer 112 which is not covered by the conductive bump 114, and the passivation layer 116 covers a portion of a sidewall 114s of the conductive bump 114. Here, the top surface 112t' may be considered as a second top surface. According to an embodiment, the passivation layer 116 includes an insulation compound, such as polyimide, an adhesive, or a combination thereof. In the present embodiment, the passivation layer 116 may protect the conductive layer 112 from oxygen or moisture. In another embodiment, a minimum thickness of the passivation layer 116 can be from 0.7 μm to 4 μm, which should however not be construed as a limitation in the disclosure; in other embodiments, the thickness of the passivation layer 116 may be increased by a printing build-up method.

Figure 1E:
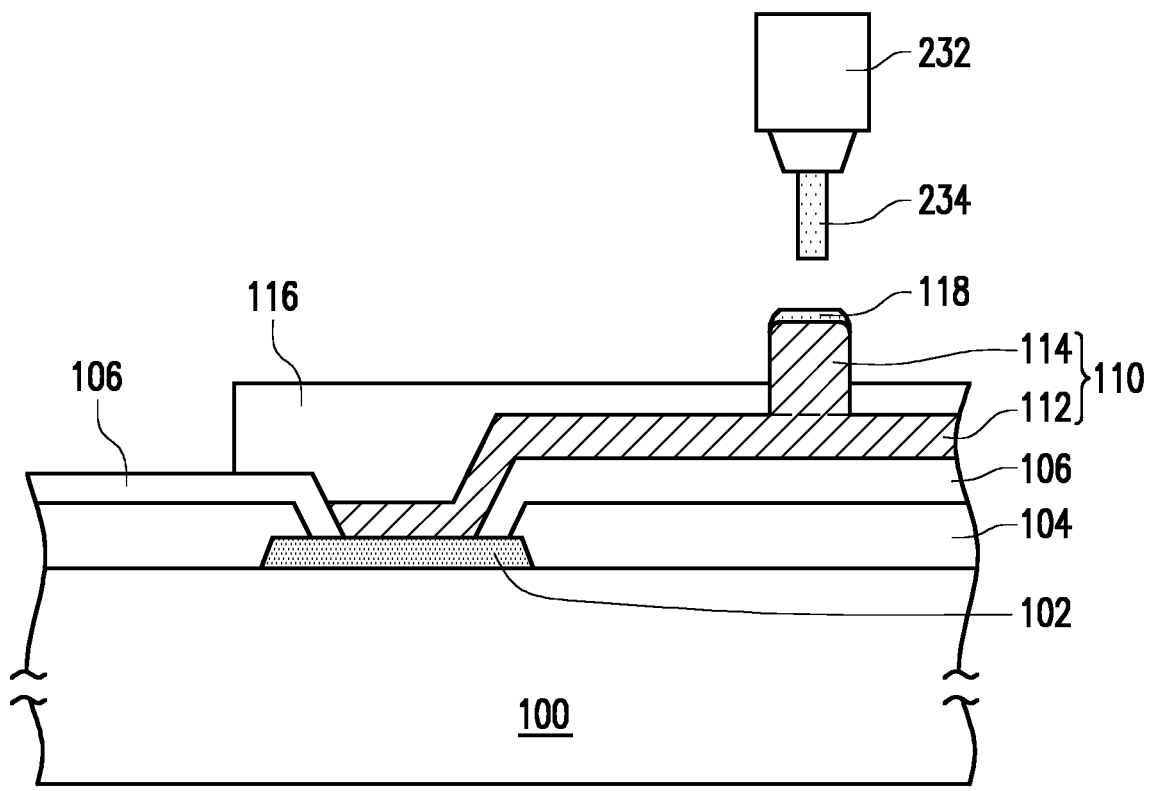

With reference to FIG. 1E, a solder layer 118 is formed by using the 3D printing technology. Specifically, a conductive ink 234 is ejected onto the conductive bump 114 by a nozzle 232 of the 3D printing apparatus to form the solder layer 118. According to an embodiment, the conductive ink 234 includes conductive particles and a solvent. The conductive particles include a plurality of metal nanoparticles, e.g., silver nanoparticles, copper-silver nanoparticles, copper nanoparticles, or a combination thereof. The solvent includes NMP, PGME, ethylene glycol, or the like. In another embodiment, a minimum thickness of the solder layer 118 may be from 0.7 μm to 4 μm, which should however not be construed as a limitation in the disclosure; in other embodiments, the thickness of the solder layer 118 may be increased by stacking repeatedly. In an alternative embodiment, the material of the solder layer 118 may be the same as or different from the material of the circuit layer 110. For instance, the material of the circuit layer 110 includes a copper-silver alloy, and the material of the solder layer 118 includes a tin-silver alloy.

To sum up, the 3D printing technology is applied in the disclosure to form the circuit layer (including the conductive layer and the conductive bump), so that the conductive layer and the conductive bump are integrally formed. Namely, the conductive layer and the conductive bump are made of the same material in the same manufacturing step, so as to prevent the adhesion and IMC issues between different materials. Thereby, the structural strength between the conductive layer and the conductive bump in the circuit structure can be significantly improved according to one or more embodiments of the disclosure, and product reliability can be further improved. In addition, the method of manufacturing the circuit structure provided herein has simple manufacturing steps, thus enhancing commercial competitiveness of the product.

Although exemplary embodiments of the disclosure have been described in detail above, the disclosure is not limited to specific embodiments, and various modifications and changes may be made within the scope of the disclosure defined in the claims.

What is claimed is:

1. A method of manufacturing a circuit structure, comprising:

forming a pad on a substrate;

forming a dielectric layer on the substrate, wherein the dielectric layer has a first opening exposing a first portion of the pad;

forming an adhesion layer on the dielectric layer by using a first 3D printing technology, wherein the adhesion layer covers a sidewall of the first opening and extends to cover a top surface of the dielectric layer, thereby forming a second opening to expose a second portion of the pad; and forming a circuit layer by using a second 3D printing technology, wherein the forming the circuit layer comprises:

forming a conductive layer, so that the conductive layer contacts the second portion of the pad and extends along a first direction from the pad to cover a top surface of the adhesion layer; and forming a conductive bump, so that the conductive bump extends along a second direction from a first top surface of the conductive layer on the adhesion layer, wherein the first direction is different from the second direction, and the conductive layer and the conductive bump are formed in the same step of the second 3D printing technology.

2. The method of manufacturing the circuit structure as recited in claim 1, wherein after forming the conductive bump, the method further comprises forming a passivation layer by using a third 3D printing technology, so that the passivation layer covers the second top surface of the conductive layer and laterally surrounds a portion of a sidewall of the conductive bump.

3. The method of manufacturing the circuit structure as recited in claim 1, wherein the forming the conductive layer comprises:
   forming a first horizontal portion on a bottom of the second opening to contact the second portion of the pad;
   forming an inclined portion along a sidewall of the second opening; and
   forming a second horizontal portion on the top surface of the adhesion layer, wherein the second horizontal portion is higher than the first horizontal portion, the inclined portion connects the first horizontal portion and the second horizontal portion, and the first horizontal portion, the second horizontal portion, and the inclined portion are integrally formed.

4. The method of manufacturing the circuit structure as recited in claim 3, wherein the conductive layer does not fill up the second opening, so that a top surface of the first horizontal portion is lower than the top surface of the adhesion layer.

5. The method of manufacturing the circuit structure as recited in claim 1, wherein an interface is free between the conductive layer and the conductive bump.

6. The method of manufacturing the circuit structure as recited in claim 1, wherein the conductive layer and the conductive bump are constituted by a plurality of conductive particles in physical contact with each other, and a portion of the plurality of conductive particles spans from the conductive layer to the conductive bump.

7. The method of manufacturing the circuit structure as recited in claim 6, wherein the plurality of conductive particles are ball-shaped conductive particles.

8. The method of manufacturing the circuit structure as recited in claim 1, wherein the forming the circuit layer by using the second 3D printing technology comprises using a conductive ink, the conductive ink comprises a plurality of metal nanoparticles, and the plurality of metal nanoparticles comprise silver nanoparticles, copper-silver nanoparticles, copper nanoparticles, or a combination thereof.

9. The method of manufacturing the circuit structure as recited in claim 8, wherein the forming the adhesion layer by using a first 3D printing technology comprises using an insulation ink, the insulation ink comprises polyimide, polyurethane, SU-8, an adhesive, or a combination thereof.

10. The method of manufacturing the circuit structure as recited in claim 1, further comprising forming a solder layer on the conductive bump by using a fourth 3D printing technology.

* * * * *